United States Patent
Menkhoff et al.

(10) Patent No.: US 9,432,039 B2
(45) Date of Patent: Aug. 30, 2016

(54) QUANTIZATION CIRCUIT AND METHOD FOR QUANTIZING AN INPUT QUANTITY

(71) Applicant: Intel IP Corporation, Santa Clara, CA (US)

(72) Inventors: Andreas Menkhoff, Oberhaching (DE); Mohamed Ibrahim, Stuttgart (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/630,953

(22) Filed: Feb. 25, 2015

(65) Prior Publication Data

US 2015/0280724 A1    Oct. 1, 2015

(30) Foreign Application Priority Data

Mar. 25, 2014 (DE) .................. 10 2014 104 142

(51) Int. Cl.
*H04N 7/26* (2006.01)
*H03M 1/06* (2006.01)
*H03M 7/30* (2006.01)

(52) U.S. Cl.
CPC ......... *H03M 1/0626* (2013.01); *H03M 7/3022* (2013.01)

(58) Field of Classification Search
CPC .................. H03M 1/0626; H03M 7/3022
USPC ........................... 341/118, 143, 200
See application file for complete search history.

(56) References Cited

U.S. PATENT DOCUMENTS

| 5,061,928 | A | * | 10/1991 | Karema | H03M 3/418 341/143 |
| 5,068,661 | A | | 11/1991 | Kaneaki et al. | |
| 5,424,739 | A | | 6/1995 | Norsworthy et al. | |
| 7,009,539 | B2 | * | 3/2006 | Okuda | H03M 7/3022 341/143 |
| 7,626,525 | B2 | * | 12/2009 | Zhou | H03M 3/352 341/118 |
| 8,994,573 | B2 | | 3/2015 | Henzler et al. | |
| 9,054,925 | B1 | | 6/2015 | Madoglio et al. | |
| 2003/0062948 | A1 | | 4/2003 | Notani et al. | |
| 2015/0036767 | A1 | | 2/2015 | Degani et al. | |
| 2015/0280724 | A1 | | 10/2015 | Menkhoff et al. | |
| 2015/0381214 | A1 | | 12/2015 | Tertinek et al. | |

FOREIGN PATENT DOCUMENTS

DE     102013113495     6/2015

OTHER PUBLICATIONS

Taiwalkar, Sumit. "Quantization Error Spectra Structure of a DTC Synthesizer via the DFT Axis Scaling Property." IEEE Transactions on Circuits and Systems—I: Regular Papers, vol. 59, No. 6, Jun. 2012, pp. 1242-1250.

Vaidyanathan, P.P. "Multirate Digital Filters, Filter Banks, Polyphase Networks, and Applications: A Tutorial." Proceedings of the IEEE, vol. 78, No. 1. Jan. 1990. pp. 56-93.

(Continued)

*Primary Examiner* — Khai M Nguyen
(74) *Attorney, Agent, or Firm* — Eschweiler & Associates, LLC (57) ABSTRACT

A quantization circuit includes a quantizer configured to provide a quantized sample using an input quantity and an error estimator configured to determine a quantization error of the quantized sample. An error corrector is configured to correct the quantized sample by a correction value depending on the quantization error.

17 Claims, 4 Drawing Sheets

(56) References Cited

OTHER PUBLICATIONS

Madoglio, Paolo et al. "A 2.5-GHz, 6.9-mW, 45-nm-LP CMOS, Delta Sigma Modulator Based on Standard Cell Design With Time-Interleaving." IEEE Journal of Solid-State Circuits, vol. 45, No. 7, Jul. 2010. pp. 1410-1420.

Non Final Office Action Dated Mar. 24, 2016 U.S. Appl. No. 14/832,342.

Notice of Allowance Dated May 17, 2016 U.S. Appl. No. 14/832,342.

* cited by examiner

QUANTIZATION CIRCUIT AND METHOD FOR QUANTIZING AN INPUT QUANTITY

FIELD

Examples relate to quantization circuits and to methods for quantizing an input quantity.

Quantizing an input quantity is often required or desirable in order to reduce memory or computational complexity. The reduction of complexity introduces quantization noise to the signal. With statistically independent input quantities, the distribution of the quantization error is flat and all possible quantization error occur with the same probability. The distribution of the quantization error is similar to the spectrum of white noise.

If a flat distribution of the quantization noise is undesirable, conventional approaches sometimes make use of feedback loops to add a quantity depending on the quantization error of the present sample to the next input quantity to be processed by a quantizer. The quantization error may additionally be processed within the feedback loop which may result in a modification of the distribution of the quantization error, which is also referred to as noise-shaping.

The more the sampling frequency increases, the faster the processing within the feedback loop is to be performed, bringing the concept to practical limits. Hence, there may be a desire to provide a quantization circuit and a method for quantizing an input quantity allowing for high sampling frequencies.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples are shown by way of example in the figures and will herein be described in detail. It should be understood, however, that there is no intent to limit examples to the particular forms disclosed, but on the contrary, further examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion.

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms used herein have the same meaning as commonly understood by one of ordinary skill in the art to which the examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
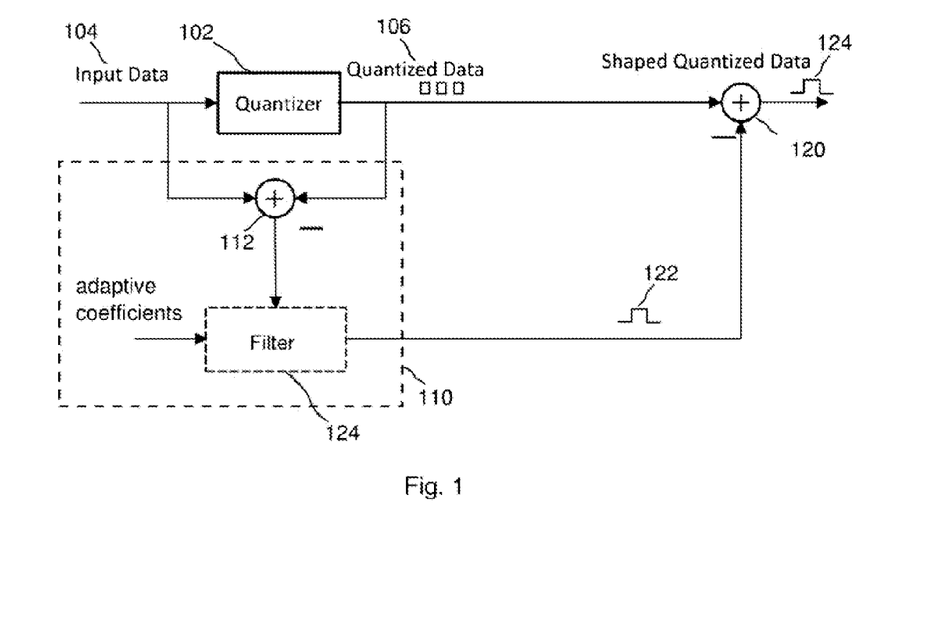
FIG. 1 illustrates an example of a quantization circuit.

FIG. 1 illustrates a schematic view of a quantization circuit 100. The quantization circuit comprises a quantizer 102 which is configured to provide a quantized sample using an input quantity 104. The input quantity 104 or a stream of input quantities is provided to the quantizer, which samples the input quantity 104 and provides a quantized sample 106 at an output. Quantization results with lowering the number of bits or information units required to represent the quantized sample 106 as compared to the corresponding input quantity 104. A quantization circuit 100 further comprises an error estimator 110 which is configured to determine a quantization error of the quantized sample 106. In the example of FIG. 1, the error estimator comprises an adder 112 as well as an optional filter 114. The adder 112 subtracts the quantized sample 106 from the input quantity 104 or vice versa, providing the quantization error per quantized sample 106.

Figure 2:
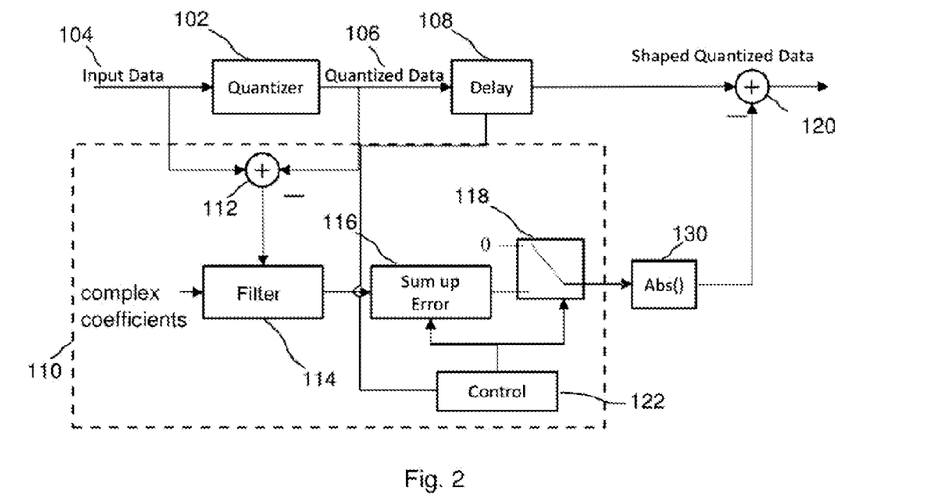
FIG. 2 illustrates a further example of a quantization circuit.
Figure 3:
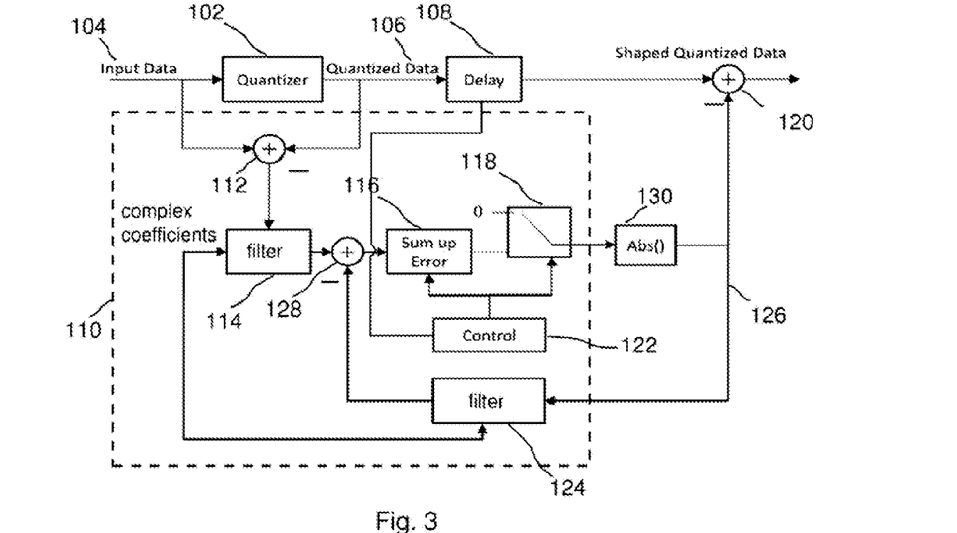
FIG. 3 illustrates a further example of a quantization circuit.

The optional filter 114 within the error estimator 110 may be used to influence or shape the distribution of the error for the quantized data, as it will be elaborated on below. The quantization circuit 100 further comprises an error corrector 120 which is configured to correct the quantized sample 106 by a correction value 122 provided by the error estimator 110. The correction value 122 depends on the quantization error determined within the error estimator 110. As a result, the error corrector 120 provides a corrected quantized sample 124 or, in the event of a continuous stream of input quantities and quantized samples, corrected quantized data. In the event of the presence of optional filter 114, the corrected quantized sample 124 may also be denoted shaped quantized sample or a shaped quantized data, considering that it exhibits a distribution of the error which is shaped to meet the practical requirements of the particular implementation. According to some examples, the quantizer circuit 100 may be implemented in the frequency domain, i.e. operating using input values corresponding to frequency components of a signal. In other examples, the quantizer circuit may also be implemented in the time domain. Although the examples detailed in FIGS. 1 to 3 are assumed to operate with real numbers, further examples may also be used to quantize complex numbers. This may be regarded as equivalent to using two quantizer circuits in parallel, one for the in-phase component I and one for the quadrature component Q of the input quantities.

In other words, FIG. 1 illustrates an example of a quantization circuit 100 which implements feed-forward error correction. In the presence of optional filter 114, this may also be called feed-forward noise shaping. This may allow to principally increase the sampling frequency without a practical limit, since the causality between the correction value 122 and the quantized sample to which the correction value 122 is applied can be maintained irrespective of the sampling frequency due to the feed-forward implementation. In case the sampling frequency is high, an optional additional delay element 108 may be introduced between the quantizer 102 and the error corrector 120 as illustrated in FIG. 2.

According to some examples, the delay introduced by the delay element 108 may correspond to the overall processing time of the error estimator 110 to maintain the causality between the correction value 122 determined using the quantization error and the quantized sample to which the correction is applied.

According to some examples, the filter 114 is used to shape the quantization noise according to the particular requirements. Arbitrary types of filters can be used, for example, finite impulse response or infinite impulse response filters. An appropriately chosen filter 114 may serve to shape the noise such that the noise distribution deviates from a flat distribution and exhibits one or more minima at desirable frequencies. Appropriately choosing the position of the minima within the noise distribution may serve to avoid undesirable disturbance to the signals spectrum. In applications where the quantizer circuit is used within transmitters for wireless signals, it may be desirable to avoid emitting power into particular parts of the spectrum, as it would be the case when quantization noise is not shaped and the power density of the noise is flat.

For example, a mobile phone may also comprise receive antennas for Bluetooth or GPS or similar applications. It may be desirable to avoid that the cellular transmitter transmits significant power into the parts of the spectrum where the Bluetooth and GPS receivers are to receive the signals. Hence, it may be desirable to reduce the quantization noise in these parts of the spectrum. This may be achieved by using appropriate filters within the examples of quantization circuits shaping the spectrum of the noise to introduce two minima at the required spectral distance between the transmission band of the cellular transmitter and the receive band of the Bluetooth and the GPS receivers. Other receivers may, of course, also be considered, and the number of minima in the power spectral density of the noise can also be chosen to be higher than two.

According to some examples, the noise filter 114 is operable with at least two different filter characteristics. To vary or alter the filter characteristics, the filter 114 may be operated with different filter coefficients or with adaptive coefficients. Different filter characteristics may serve to adapt the noise shaping characteristics to achieve the required spectral distance to the transmission band if different transmit frequencies or transmission bands are used. If, for example, long-term evolution mobile phones are used, the frequency band used for uplink transmission may change from transmit frame to transmit frame. Consequently, the spectral distance between the transmit frequency of the cellular transmitter and the fixed and receive frequencies of, for example, Bluetooth or GPS applications, changes. In order to maintain good suppression of the disturbance from the transmitters quantization noise to the additional devices, the noise filter 114 needs to be adapted when the transmit frequency changes so as to maintain the minimum of the noise power at the same absolute position within the spectrum.

Some examples, hence, provide the possibility of using noise filters 114 with at least two different filter characteristics or with an arbitrary number of filter characteristics. According to some examples, the error estimator 110 further comprises a memory for storing different sets of filter coefficients for the noise filter 114 so that the filter may be operated with different filter characteristics. The functionality of the noise filter 114 may also be understood as an equivalent to a correlator receiving a reference signal to which the quantization errors are correlated. The reference signal indicates, for example, the spectral distance of the desired minimum of the noises PSD with respect to the transmit frequency of a wireless channel. Correlating the quantization errors to the reference signal may be understood as further processing the quantization errors so that a minimum of the PSD of the processed quantization errors corresponds to a position indicated by the reference signal.

The example of FIG. 2 illustrates an optional delay element 108 between the quantizer 102 and the error corrector 120. The delay element 108 may, for example, introduce a delay that corresponds to the overall processing time of the error estimator 110 so that the correction value 122 is applied to the appropriate quantized sample. Further examples, however, may not employ a delay element 108, as illustrated in FIG. 1.

In the example of FIG. 2, the error estimator 110 further comprises an error accumulator 116 which is configured to determine an accumulated error estimation using the quantization errors of subsequent quantized samples. In the example of FIG. 2, for each quantized sample of the continuous stream, a quantization error is determined, which is subsequently filtered by the noise filter 114. The so determined filtered quantization errors are summed up within the error accumulator 116. Summing up the filtered quantization errors in the error accumulator 116 may serve to accumulate subsequent filtered quantization errors so as to exceed a threshold given by the value corresponding to the least significant bits of the quantized samples.

Further, the number of samples for which the accumulated error estimation is determined in the error accumulator 116 may provide for a computationally and energy-wise efficient solution to adjust the spectrum of the quantization noise and, in particular, to determine the width of a notch or minimum in the PSD of the noise component of the resultant signal. In the particular implementation of FIG. 2, the number n of summations before a correction is applied is determined by a switch 118 within the error estimator 110. The switch 118 forwards the content of the error accumulator 116 to the error corrector 120 every n quantized samples so that it is considered by or subtracted from every n-th quantized sample. In the example of FIG. 2, the filtered quantization errors of n subsequent quantized samples are summed up before the sum or the accumulated error estimation is applied as a correction value to every n-th quantized sample.

Figure 4:
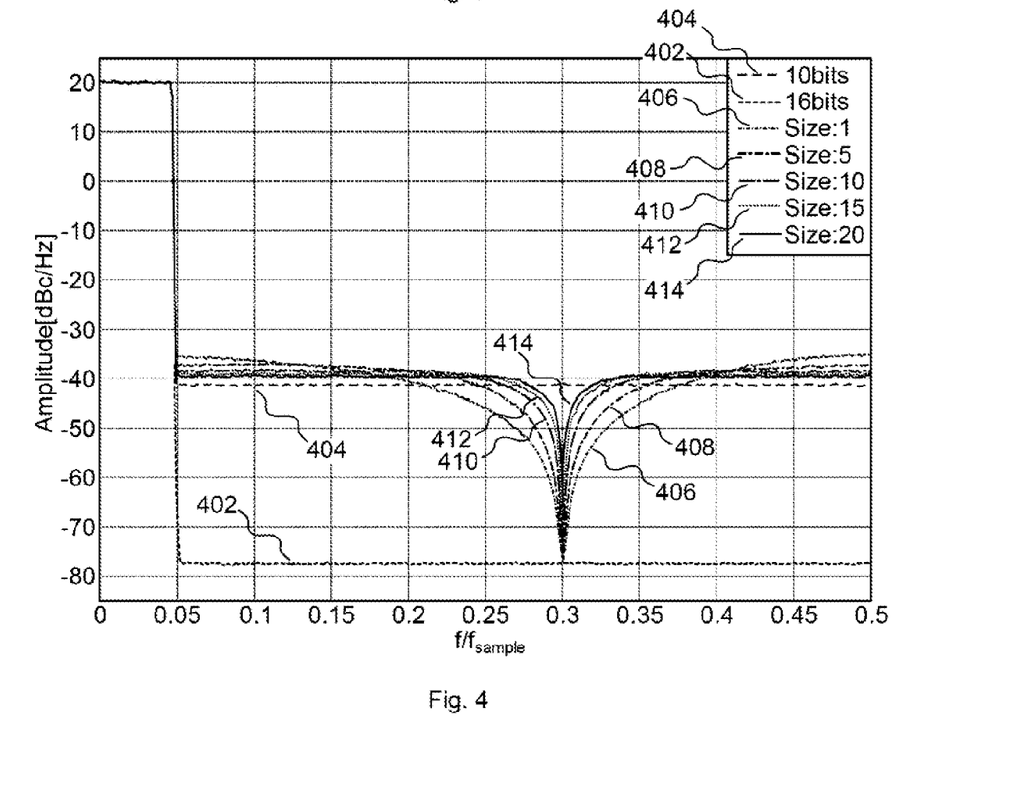
FIG. 4 illustrates examples of noise distributions achievable using an example of a quantization circuit.

A controller 122 serves to close the switch 118 serving, together with the controller 122, as a correction timer so that the content of the error accumulator 116 is used as a correction value every n-th quantized sample. The absolute value of the content of the error accumulator 116 is created by correction value creator 130. According to some examples, the parameter n is variable or adjustable during operation so as to be able to efficiently alter the filter characteristics of the notch or of different notches within the noise spectrum. In particular, high parameters or values of n result with a smaller bandwidth of the notch, i.e. a notch having a smaller width and a lower overall error energy, which is the energy of the noise component integrated over the full spectrum. To the contrary, small values of n result with comparatively wide notches and an increased overall error energy, as illustrated in FIG. 4. According to some examples, the controller 122 also serves to control the delay time of the delay element 108 so as to maintain the delay time equivalent to the overall processing time of the error estimator when the parameter n is changed.

FIG. 4 schematically illustrates, for a bandwidth limited signal, signals provided by a quantizer requantizing the signal from a resolution of 16 bits to 10 bits. FIG. 4 illustrates the normalized frequency on the x-axis and the amplitude as a function of the normalized frequency on the y-axis. The original signal with 16 bit resolution is illustrated as a first graph 402 while the quantized signal is represented by a second graph 404. As it becomes apparent from FIG. 4, the lower resolution of the quantized signal 404 provides an increased and expectedly constant noise floor to the right of the normalized spectrum of FIG. 4, amounting to roughly −40 dBc/Hz, as compared to the noise level of the original signal 402, which amounts to roughly −77 dBc/Hz.

Graphs 406 to 414 illustrate the shaped noise achieved by some examples using filters 114 as described herein, depending on the parameter n, i.e. on the number of quantized samples between the application of subsequent correction values by the error corrector 120. The previously discussed dependency of the error signal from the parameter n is clearly illustrated in FIG. 4.

FIG. 3 illustrates a further example in which the error estimator 110 further comprises a further filter 124 within a return path 126. The return path 126 is configured to provide information on a difference between the correction value 122 applied by the error corrector 120 and the accumulated error stored within the error accumulator 116 at the time instant where the correction is applied. In other words, the return path 126 serves to feed back the fraction of the absolute value of the accumulated error which is not applied by the error corrector 120, e.g. since it is smaller than the value represented by a single quantization step. The fraction is fed back to the error accumulator 116 so that this contribution to the accumulated error is maintained. To furthermore preserve the desired spectral behavior or shaping of the quantization noise, also the fed back fraction is filtered by means of a further optional filter 124. Further filter 124 may be identical or similar to the filter 114 so that the feedback of the fraction of the accumulated error which is not applied receives the desired spectral shaping before being input into the error accumulator 116. According to some examples, filter 124 may be omitted. The example of FIG. 4 serves to permanently accumulate the quantization error while the correction value determined using the accumulated error estimation is applied to every n-th sample.

In other words, FIGS. 1 to 3 illustrate examples of quantization circuits where the quantization noise is isolated and correlated to a carrier frequency range. The quantization noise is filtered to show a desirable frequency behavior. The filtered or correlated quantization noise is summed up and the correction is performed after the quantizer to cancel out the summed up value. The correction may be performed at a fixed rate, i.e. every n-th sample may be corrected. The feed-forward approach may serve to improve the excess out-of-band noise introduced by conventional delta sigma circuits. Further, the speed problem due to the feedback structure of conventional approaches may be alleviated or solved. That is, examples as described herein may be used with arbitrary high sampling speeds. Further, stability of the noise shaping or the correction of quantization noise may be maintained over all frequency conditions. This may serve to avoid instability problems which may arise in a feedback structure due to quantization effects or long delays within feedback loops. In the example illustrated in FIG. 1, the quantization noise is isolated by subtracting the quantized data from the input data. This quantization noise is fed into a correlation unit or a filter. The correlation unit or filter calculates the degree of similarity between a quantization noise and a certain frequency range. The output signal is the updated frequency component based on the current sample. Based on this frequency value, a correction is applied after the quantizer, i.e., quantization noise is corrected in a feed-forward approach.

In the example illustrated in FIG. 2, the output of the filter 114 or the correlation unit is input into a summing block or error accumulator 116 which sums the current frequency sample with the frequency bins from the previous samples. Based on the summed up frequency component, a correction is applied by adding a value to the quantized data, i.e., to a quantized sample, in terms of multiples of the least significant bit. In the example of FIG. 2, a control signal is provided by a controller 122 which determines how often the correction is applied. The controller 122 operates a switch 118 every n samples to apply the correction. The correction may be the absolute value of the accumulated complex frequency component. After performing the correction, the summing block or error accumulator may be updated as illustrated in FIG. 3. This is achieved by feeding the correction into the correlation circuit or filter 124 corresponding to the filter 114 and by adding it before the error accumulator 116 to update the value for the present frequency bin after the correction.

FIG. 4 illustrates a result as obtained by an example described herein. FIG. 4 illustrates a band limited signal. Further, out-of-band quantization noise is illustrated. Graph 402 shows the signal quantized using 16 bits and graph 404 illustrates the same signal quantized using 10 bits. The noise shaper or quantization circuit quantizes the 16 bit signal to the 10 bit resolution while having a notch at 0.3 Hz. The other curves show the spectrum of the noise shaped signal using an example of a feed-forward noise shaper having different correction rates. For example, graph 408 shows the result when a correction is applied after every fifth sample. The correction rate may be controlled by the controller 122, illustrated in FIGS. 2 and 3. As illustrated in FIG. 4, a trade-off between the bandwidth of the notch filter and the out-of-band noise can be achieved easily, by varying the parameter n.

Figure 5:
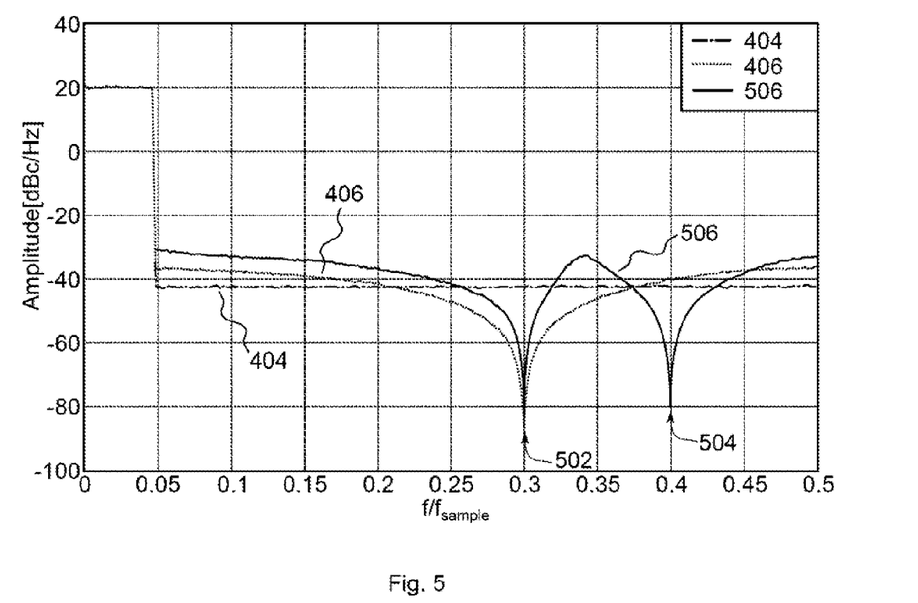
FIG. 5 illustrates an example of a further noise distribution having two minima.

FIG. 5 further illustrates the great flexibility of the examples described herein. As illustrated in FIG. 5, multiple notches within the distribution of the error contributions can be achieved within a desired frequency range. That is, one may have multiple zeros in an example of a feed-forward based quantization circuit. This may, for example, be achieved by correlating the quantization error to several frequency ranges. This corresponds to the use of a filter having appropriately chosen filter coefficients or filter characteristics. In an alternative approach, the corrections may be applied alternatively. According to the examples described herein, the bandwidth of each notch frequency, i.e. for example of the first notch 502 and of the second notch 504 of FIG. 5 as well as the depth of each of the notches may be chosen individually by adjusting the correction rate for each of the notches independently. This may not be achieved in conventional approaches using feedback based noise shaping with similar simplicity or with comparable efficiency.

Figure 6:
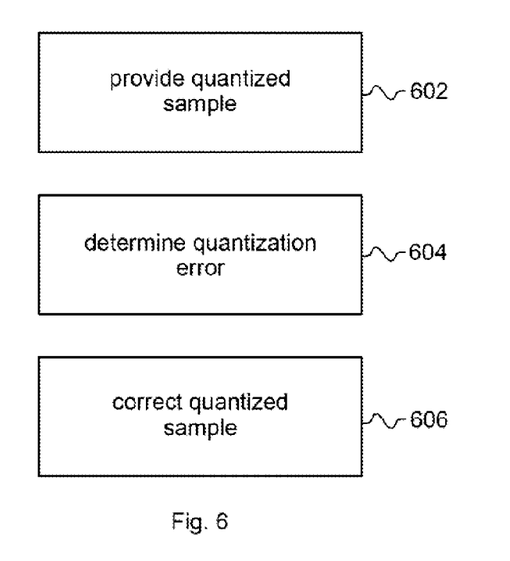
FIG. 6 schematically illustrates an example of a method for quantizing an input quantity.

FIG. 6 schematically illustrates a block diagram of an example of a method for quantization. The method comprises providing 602 of a quantized sample using an input quantity. The method further comprises determining 604 the quantization error of the quantized quantity. Further, in 606 the quantized sample is corrected by a correction value depending on the quantization error.

That is, according to the method illustrated in FIG. 6, the quantization error is corrected in a feed-forward manner. While examples of quantization circuits can be beneficially used in every application where quantization is performed, a particularly attractive implementation may be within a transmitter used, for example, in telecommunication applications. For example, the noise shapers may be implemented before a digital-to-analog converter, before a digital-to-time converter or before a digitally-controlled oscillator in order to down-sample the previously-calculated values to a word length which can be handled by the subsequent components in the transmission chain. By using an example as described herein, the transmitters can be operated with great flexibility and without introducing quantization associated noise components into the spectrum. That is, transmitters using quantization circuits as described herein may generate a transmission signal which does not disturb further receive components within the vicinity of the transmitter, as for example GPS or Bluetooth receive circuits in mobile phones or the like.

Figure 7:
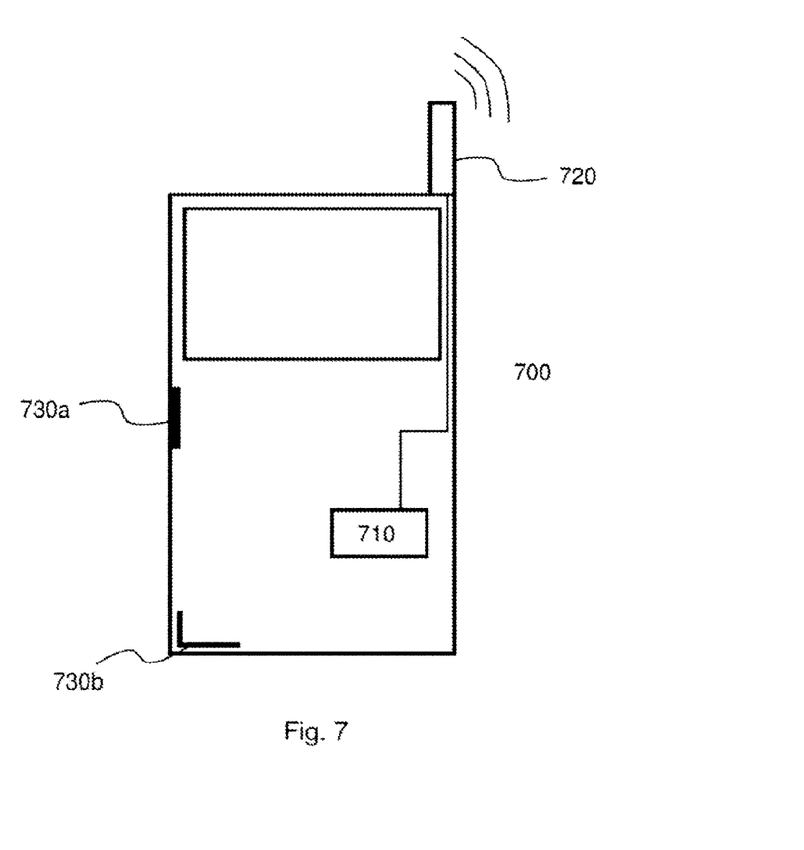
FIG. 7 schematically illustrates an example of a mobile phone.

FIG. 7 schematically illustrates an example of a mobile telecommunications device or a user equipment or mobile phone 700 of a mobile telecommunications network comprising a transmitter 710 using a quantization circuit 100 according to an example. The transmitter 710 is coupled to an antenna 720 used to send or transmit the wireless communication signal of the mobile telecommunications device 700. Mobile telecommunication devices or mobile phones 700 incorporating an example of a quantizer circuit as described herein may be used to also support various carrier aggregation scenarios of today's or future transmission architectures, as for example LTE carrier aggregation. Since the transmit signals as being provided or generated by the examples described herein avoid the introduction of additional spurious or noise components potentially disturbing neighboring frequency bands, the reception of signals by different antennas 730a and 730b within the system may not be disturbed due to the transmission of the mobile phones uplink signal.

Example 1 is a quantization circuit, comprising a quantizer configured to provide a quantized sample using an input quantity; an error estimator configured to determine a quantization error of the quantized sample; and an error corrector configured to correct the quantized sample by a correction value based on the quantization error.

In example 2, the subject matter of examples 1 optionally further comprises a delay element coupled between the quantizer and the error corrector.

In example 3, the delay time of the delay element corresponds to a processing time of the error estimator.

In example 4, the subject, the error estimator of examples 1 to 3 optionally further comprises a noise filter configured to provide a filtered quantization error.

In example 5, the noise filter of example 4 is operable with a plurality of different filter characteristics.

In example 6, the quantization circuit of example 5 further comprises a memory storing different sets of filter coefficients for the plurality of different filter characteristics.

In example 7, the error estimator of any of the preceding examples optionally further comprises an error accumulator configured to determine an accumulated error estimation using the quantization error of subsequent quantized samples.

In example 8. The quantization circuit of claim 7, wherein the error corrector further comprises a correction timer configured to correct every n-th quantized sample using the accumulated error estimation.

In example 9, the parameter n of example 8 is variable.

In example 10, the error estimator of examples 8 or 9 optionally further comprises a return path configured to provide information on a difference between the correction value and the accumulated error estimation as an input to the error accumulator.

In example 11, the error estimator of example 10 further optionally comprises a further filter 124 configured to provide the information on the difference between the correction value and the accumulated error estimation using the difference between the correction value and the accumulated error estimation as an input.

Example 12 is a method for quantization, comprising providing a quantized sample using an input quantity; determining a quantization error of the quantized quantity; and correcting the quantized sample by a correction value based on the quantization error.

In example 13, the method of example 12 optionally further comprises delaying the quantized sample.

In example 14, the quantized sample of example 13 is delayed by a processing time of the error estimator.

In example 15, the method of example 12 to 14 optionally further comprises filtering the quantization error to provide a filtered quantization error.

In example 16, the filtering of example 15 can be performed with a plurality of different filter characteristics.

In example 17, the method of example 16 further optionally comprises reading different sets of filter coefficients for a plurality of different filter characteristics from a memory.

In example 18, the method of examples 12 to 17 optionally further comprises determining an accumulated error estimation using the quantization error of subsequent quantized samples.

In example 19, every n-th quantized sample of the method of example 18 is corrected using the accumulated error estimation.

In example 20, the method of example 19 optionally further comprises changing the parameter n.

In example 21, the method of examples 19 or 20 optionally further comprises using information on a difference between the correction value and the accumulated error estimation as a contribution to the accumulated error estimation.

In example 22, the method of example 21 optionally further comprises filtering the difference between the correction value and the accumulated error estimation.

Example 23 is a transmitter having a quantization circuit of any of examples 1 to 11.

In example 24, the transmitter of example 23 uses sample values within the frequency domain as input quantities.

Example 25 is a mobile telecommunications device having a transmitter according to examples 23 or 24.

Example 26 is means for quantizing, comprising means for providing a quantized sample using an input quantity; means for determining a quantization error of the quantized quantity; and means for correcting the quantized sample by a correction value based on the quantization error.

In example 27, the means for quantizing of example 26 optionally further comprises means for delaying the quantized sample.

Example 28 is a computer program having a program code for performing the method of any of examples 12 to 22, when the computer program is executed on a computer or processor.

Example 29 is a computer readable storage medium having stored thereon a program having a program code for performing the method of any of examples 12 to 22, when the computer program is executed on a computer or processor.

While the previous examples have mainly been illustrated and explained with respect to their possible use for a mobile telecommunication system or a user equipment, further examples may be implemented in arbitrary other wireless transmission systems. Examples for those systems may be another one of the 3GPP-standardized mobile communication networks or mobile communication systems. The mobile or wireless communication system may correspond to, for example, a Long-Term Evolution, an LTE-Advanced, High Speed Packet Access, a Universal Mobile Telecommunication System or a UMTS Terrestrial Radio Access Network, an evolved-UTRAN, a Global System for Mobile communication or Enhanced Data rates for GSM Evolution network, a GSM/EDGE Radio Access Network, or mobile communication networks with different standards, for example, a Worldwide Inter-operability for Microwave Access network IEEE 802.16 or Wireless Local Area Network IEEE 802.11, generally an Orthogonal Frequency Division Multiple Access network, a Time Division Multiple Access network, a Code Division Multiple Access network, a Wideband-CDMA network, a Frequency Division Multiple Access network, a Spatial Division Multiple Access network, etc. Further examples of receiver systems or tuning circuits may also be used in connection with other wireless communication standards or protocols, such as for example Bluetooth, ZIGBEE or the like.

Example examples may further provide a computer program having a program code for performing one of the above methods, when the computer program is executed on a computer or processor. A person of skill in the art would readily recognize that steps of various above-described methods may be performed by programmed computers. Herein, some example examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example examples are also intended to cover computers programmed to perform the acts of the above-described methods or programmable logic arraysPLAs) or programmable gate arraysPGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function.

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor hardware, network processor, application specific integrated circuit, field programmable gate array, read only memory for storing software, random access memory, and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A quantization circuit, comprising:
   a quantizer configured to provide a quantized sample using an input quantity;
   an error estimator configured to determine a quantization error of the quantized sample;
   an error corrector configured to correct the quantized sample by a correction value based on the quantization error;
   wherein the error estimator comprises an error accumulator configured to determine an accumulated error estimation using the quantization error of subsequent quantized samples;
   wherein the error corrector further comprises a correction timer configured to correct every n-th quantized sample using the accumulated error estimation; and
   wherein n is an integer variable.

2. The quantization circuit of claim 1, further comprising:
   a delay element coupled between the quantizer and the error corrector.

3. The quantization circuit of claim 2, wherein a delay time of the delay element corresponds to a processing time of the error estimator.

4. The quantization circuit of claim 1, wherein the error estimator further comprises a noise filter configured to provide a filtered quantization error.

5. The quantization circuit of claim 4, wherein the noise filter is operable with a plurality of different filter characteristics.

6. The quantization circuit of claim 5, further comprising a memory storing different sets of filter coefficients for the plurality of different filter characteristics.

7. A method for quantization, comprising:
   providing a quantized sample using an input quantity;
   determining a quantization error of the quantized quantity;
   correcting the quantized sample by a correction value based on the quantization error;
   determining an accumulated error estimation using the quantization error of subsequent quantized samples;
   wherein every n-th quantized sample is corrected using the accumulated error estimation; and
   wherein n is an integer variable.

8. The method of claim 7, further comprising:
   delaying the quantized sample.

9. The method of claim 8, wherein the quantized sample is delayed by a processing time of the error estimator.

10. The method of claim 7, further comprising filtering the quantization error to provide a filtered quantization error.

11. The method of claim 10, wherein filtering can be performed with a plurality of different filter characteristics.

12. The method of claim 11, further comprising reading different sets of filter coefficients for a plurality of different filter characteristics from a memory.

13. The method of claim 7, further comprising using information on a difference between the correction value and the accumulated error estimation as a contribution to the accumulated error estimation.

14. The method of claim 13, further comprising filtering the difference between the correction value and the accumulated error estimation.

15. A computer readable non-transitory storage medium having stored thereon a program having a program code comprising executable instructions for performing the method of claim 7, when the program code comprising executable instructions of the computer program is executed on a computer or processor.

16. A means for quantizing, comprising:
    means for providing a quantized sample using an input quantity;
    means for determining a quantization error of the quantized quantity;
    means for correcting the quantized sample by a correction value based on the quantization error;
    means for determining an accumulated error estimation using the quantization error of subsequent quantized samples;
    wherein every n-th quantized sample is corrected using the accumulated error estimation; and
    wherein n is an integer variable.

17. The means for quantizing of claim 16 further comprising:
    means for delaying the quantized sample.

* * * * *